United States Patent [19]
Grouffal et al.

[11] Patent Number: 5,245,647
[45] Date of Patent: Sep. 14, 1993

[54] METHOD AND DEVICE FOR SYNCHRONIZING ON AN OUTSIDE EVENT THE SAMPLING OF MEASURING SIGNALS THROUGH A DIGITIZING ASSEMBLY OF THE OVERSAMPLING TYPE

[75] Inventors: Christian Grouffal, Rueil-Malmaison; Gérard Thierry, Nanterre, both of France

[73] Assignee: Institut francais du petrole, Rueil-Malmaison Cedex, France

[21] Appl. No.: 760,941

[22] Filed: Sep. 17, 1991

[30] Foreign Application Priority Data

Sep. 17, 1990 [FR] France .................. 90/11527

[51] Int. Cl.$^5$ ............................. H04B 3/04
[52] U.S. Cl. ....................... 377/20; 377/54; 377/55; 375/106; 375/111; 341/155
[58] Field of Search ............. 377/20, 54, 55; 375/106, 111; 341/155

[56] References Cited

U.S. PATENT DOCUMENTS

| | | | |
|---|---|---|---|
| 4,411,006 | 10/1983 | Horna .................. | 375/106 |
| 4,527,145 | 7/1985 | Haussmann et al. ............ | 358/19 |
| 4,628,494 | 12/1986 | Rialan et al. . | |
| 4,799,025 | 1/1989 | Le Queau . | |
| 4,815,103 | 3/1989 | Cupo et al. ............ | 375/106 |
| 4,847,880 | 7/1989 | Kamerman et al. ........... | 375/106 |

FOREIGN PATENT DOCUMENTS 2019170 10/1979 United Kingdom .
2071847 9/1981 United Kingdom .

OTHER PUBLICATIONS

*L'Electricite Electronique Moderne*, vol. 44, No. 280, 1974, pp. 17-19, Paris, Fr; R. Miquel: "L'enregistrement des phenomenes transitoires sur les memoires electroniques"-Chapitre 2.1; FIGS. 1,3.

*Primary Examiner*—William L. Sikes
*Assistant Examiner*—Scott A. Ouellette
*Attorney, Agent, or Firm*—Antonelli, Terry, Stout & Kraus

[57] ABSTRACT

A digitalization assembly of the over-sampling type includes an analog to digital converter (2) producing at a frequency $F=kf$ small-format p samples and a digital filter (3) which, through the summation of a certain number n of over-samples, produces validated larger P-format samples at the frequency f, at instants fixed by a clock. In order to readjust the sampling instants in relation to an outside event which can occur at any time, a temporary memory store (5) is inserted between the converter (2) and the filter (3) and, according to the instant of arrival of this event, the appropriate samples to be sent towards the filter for their summation are selected.

18 Claims, 3 Drawing Sheets

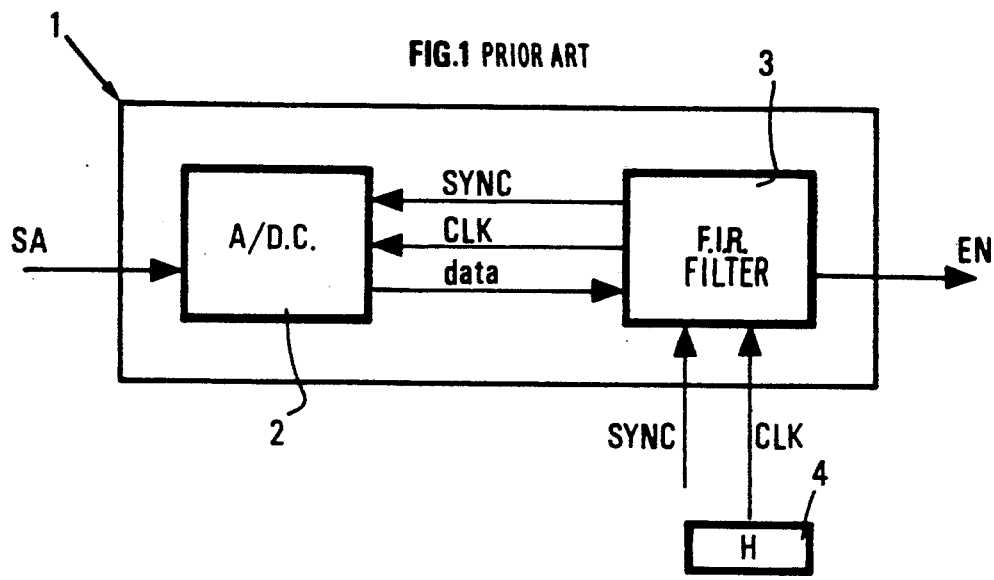
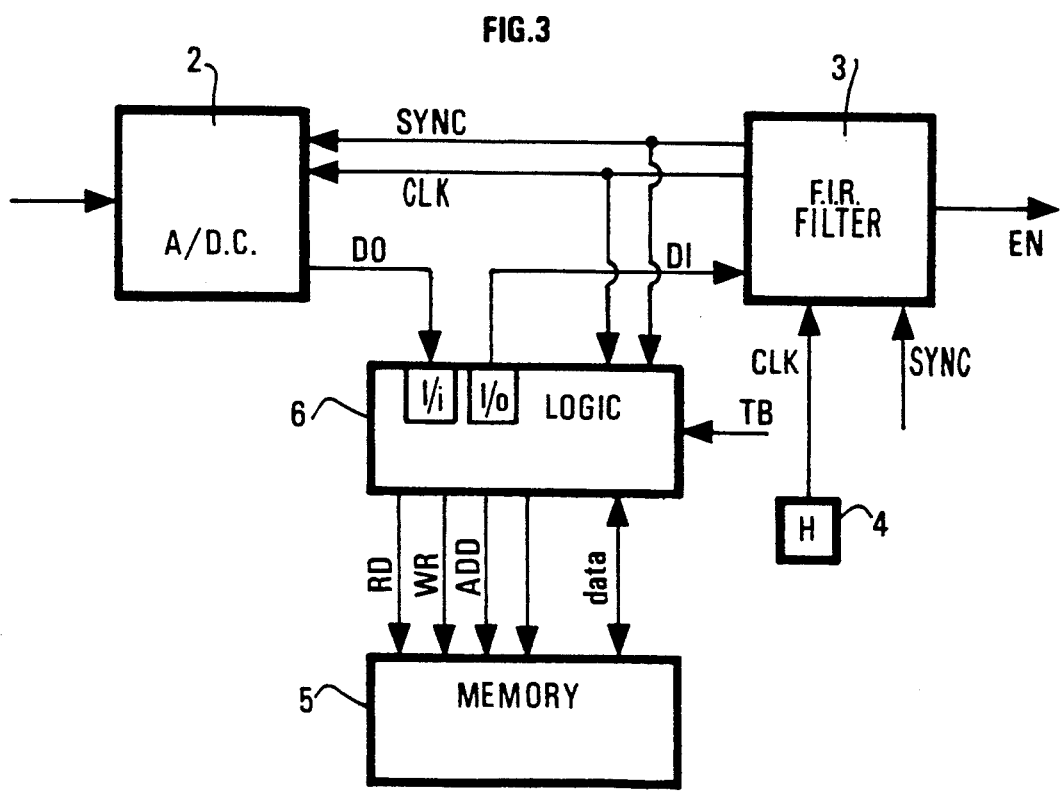

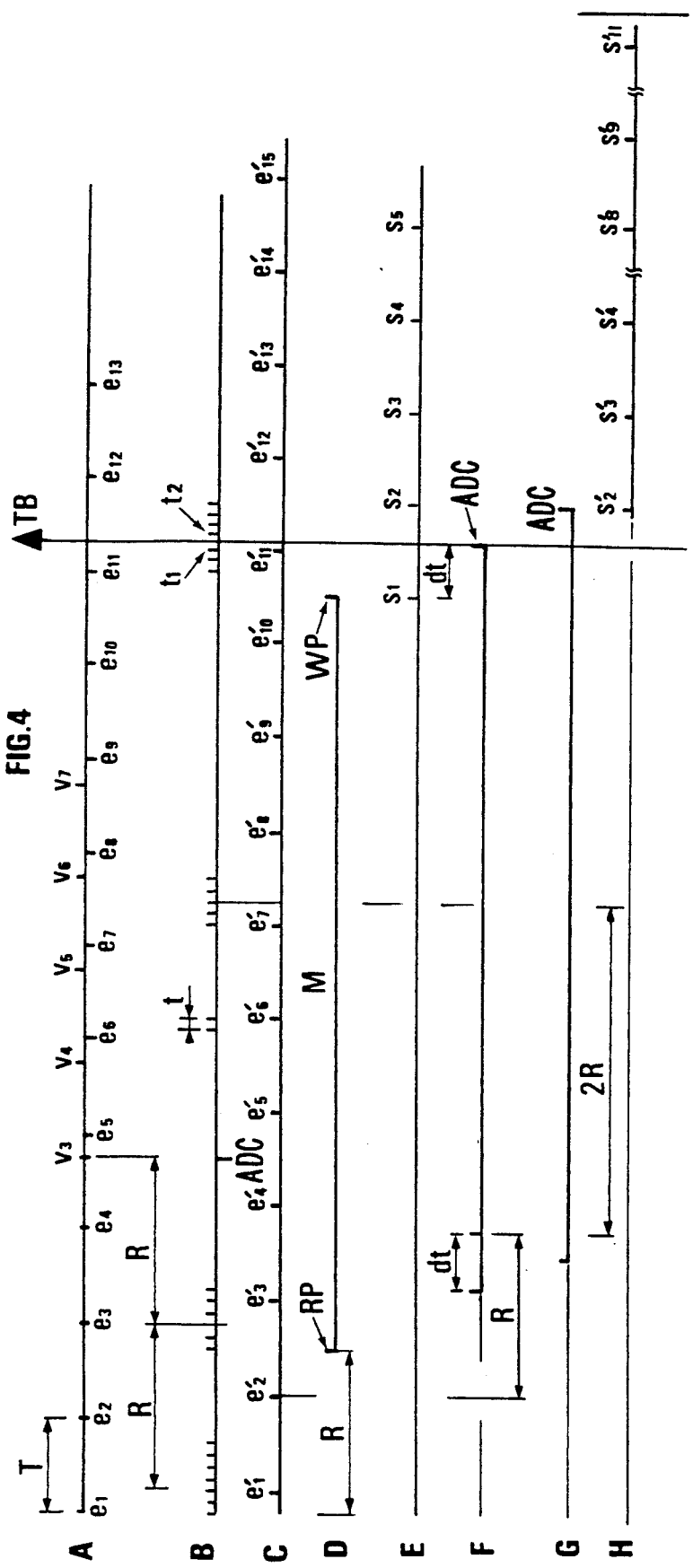

METHOD AND DEVICE FOR SYNCHRONIZING ON AN OUTSIDE EVENT THE SAMPLING OF MEASURING SIGNALS THROUGH A DIGITIZING ASSEMBLY OF THE OVERSAMPLING TYPE

BACKGROUND OF THE INVENTION

The object of the present invention is to provide a method and a device for synchronizing with a reference signal marking an outside event the sampling of measuring signals through a digitizing assembly of the over-sampling type.

Such a digitizing assembly finds applications in all the fields where different measured signals are to be sampled for example, by means of several different acquisition chains by imposing that the series of samples substantially synchronize with one another. It is notably the case in the field of seismic exploration where a reference instant in relation to which propagation time intervals are counted is to be fixed for an acquisition system.

The initial reference instant that is generally selected is the instant of release of a source of seismic waves. The emitted waves are propagated in the subsoil and are received by seismic sensors distributed at the ground surface, for example. The signals delivered by these sensors are transmitted to a central control and recording laboratory, either directly or following more recent methods, by means of acquisition devices distributed in the field. Each one of them is adapted for amplifying, filtering, digitizing and storing all the signals picked up following each release of the source. After each emission-reception cycle or after a certain number of them, the stored data are centralized in the laboratory. Seismic acquisition systems are, for example, described in patents FR 2,511,772 (U.S. Pat. No. 4,583,206) or FR 2,538,194 (U.S. Pat. No. 4,628,494).

In each acquisition apparatus, the seismic signals are applied to an acquisition chain. A common acquisition chain structure comprises a fixed-gain preamplifier, a high-pass filter, an anti-aliasing low-pass filter and an analog to digital converter (A.D.C.) preceded by a variable-gain amplifier (V.G.A.) whose gain is adapted to the dynamics of the converter. The converters generally deliver 12 to 16-bit digital words which are completed by a 4-bit word giving in a binary form the gain applied to each digitized sample. This conventional structure, mostly analog, has numerous drawbacks. A variable-gain amplifier is difficult to adjust and subject to thermal variations. The cost of a stable amplifier is therefore relatively high. It is the same for the anti-aliasing filter because several switchable ones must generally be available, each one adapted to a possible sampling pitch.

SUMMARY OF THE INVENTION

Many drawbacks of an acquisition chain of the analog type are avoided with the technique known as over-sampling. The structure of such a chain is simplified. The acquisition chain amounts to a preamplifier, a high-pass filter, an over-sampling converter and a digital filter. This type of converter has larger conversion dynamics, which makes it possible to suppress the variable-gain amplifier (V.G.A.), and the functions of the anti-aliasing filter are carried out by the digital filter which follows the analog to digital converter (A.D.C.).

The over-sampling technique is implemented by means of a analog to digital converter producing digital words with a smaller format than a conventional converter but capable of sampling signals at a much higher frequency. Normal dynamics are restored by applying the signals coming from the converter to a special digital filter which, apart from the filtering functions thereof, is adapted for summing a determined number of samples with appropriate weightings, as is well-known by specialists. An over-sampling converter produces, for example, 1-bit words at a frequency of several hundred kHz. After the summing and the filtering operation which it carries out on a large number of these 1-bit words, the digital filter produces, for example, at least 20-bit digital words at a sampling frequency ranging around 1 kHz (125 Hz to 4 kHz for example).

An analog to digital converter digitizes series of analog samples taken on a signal at instants fixed by an inner clock. This is no drawback when the converter works separately. It becomes one in all the cases where an initial reference instant, in relation to which a sequence of events is located, is to be fixed with precision, and above all when signal acquisitions are to be carried out through an assembly of different converters. In seismic prospecting operations notably, the seismic waves coming from the subsoil after the emission of seismic signals by a source are picked up by a multiplicity of sensors and converted into digitized samples by an often considerable assembly of different acquisition chains, each one fitted with an analog to digital converter. A reference instant is selected, generally that when the seismic source is released, and the first sample taken by the different converters on each one of the signals picked up is to be adjusted in relation to this instant. If the sampling instant of each converter is only dependent on an inner clock, there is no reason that it should synchronize on the outside event chosen as a reference. A certain jitter follows therefore, which is generally different from one acquisition chain to another. The consequence of this is a lack of synchronization which is very bothering when combinations of signals received and acquired by different acquisition chains are to be performed, as is generally the case in all the conventional seismic treatments.

The device according to the invention makes it possible to synchronize with a reference signal marking an outside event the sampling of measuring signals through a digitizing assembly fitted with an analog to digital converter of the over-sampling type associated with a clock producing synchronization signals and a digital filter adapted for producing, from the measuring signals and with a fixed period, a multiple of the sampling period of said converter, a series of validated samples, each one resulting from the summation of a determined number n of samples coming from the analog to digital converter, and thereby to avoid the drawbacks mentioned above.

It comprises shifting means to force the producing, by the digital filter, of a series of validated samples, the first one thereof corresponding to a sample taken on the input signal with a shift independent of the reference instant.

The shifting means are, for example, adapted for forcing the production by the digital filter of said first validated sample, with a shift at the most equal to a defined fraction of said fixed period, this fraction being, for example, equal to at least one sampling period.

The shifting means for forcing the emission by the digital filter of the first validated sample comprise, for example, a memory for a number N of samples greater than the number n of samples to be summed by the digital filter to produce any validated sample, and a control assembly adapted for ordering, at the reception of said reference signal, the selective extraction of n samples selected according to the instant of arrival of said reference signal and the transfer thereof into the digital filter, so that the first sample validated after the reference signal produced by the digital filter corresponds to a sample taken on the measuring signals with a shift at the most equal to a defined number of sampling periods.

A control assembly adapted for ordering the extraction of the n samples preceding the arrival of the reference signal and for transferring thereof into said digital filter is, for example, used.

It is also possible to utilize a control assembly adapted for ordering the extraction of n samples distributed in time on either side of the instant of arrival of the reference signal.

The memory being fitted with a writing pointer and a reading pointer, the control assembly comprises, for example, a counter for storing the number of sampling periods within a time interval t at the most equal to one of said fixed periods, allowing to locate the instant of arrival of the reference signal, and means for shifting said pointers in relation to one another according to the number stored by said counter, in order to select the samples constituting the first sample validated after the reference instant.

As for the memory, a memory of the F.I.F.O. revolving type designed for working with a delay line, the delay applied to the samples transmitted to the digital filter being at the most equal to the duration of the sampling of the N samples in the memory.

With the device according to the invention, such as defined above, it is possible to obtain optimum synchronization since the first validated sample of each signal to be measured is only separated in time from the reference signal by a very limited interval, which is smaller than the sampling period and which is substantially always the same.

The method according to the invention allows make it possible to synchronize with a common reference signal marking an outside event the sampling of measuring signals respectively by a plurality of signal digitizing devices, each one comprising an analog to digital converter of the over-sampling type, each one associated with a clock producing synchronization signals and a digital filter adapted for producing from the measuring signals and with a fixed period (T) a series of validated samples, each one resulting from the summation of a sequence of n successive samples coming from the analog to digital converter and obtained by over-sampling. The method comprises:

storing a determined number N of samples greater than the number n of each sequence of samples coming from each one of said analog to digital converters before their application to the corresponding digital filter, selecting among the permanently stored N samples of each measuring signal a time shifted sequence of n successive samples so that the corresponding validated sample coming from each digital filter corresponds to a sample taken on each signal with a shift independent of the reference instant and substantially the same for all the digitalization devices.

The time shift applied for selecting each sequence is obtained, for example, by measuring the time separating the instants of emission of the validated samples from the instant of arrival of the reference signal.

The method according to the invention makes it possible to make series of samples substantially synchronous, which notably facilitates all the treatment operations implying combinations of different series.

BRIEF DESCRIPTION OF THE DRAWINGS

Other features and advantages of the device according to the invention will be clear from reading the description hereafter of an embodiment procedure given by way of non limitative example, with reference to the accompanying drawings in which:

FIG. 1 diagrammatically shows the structure of an over-sampling analog to digital converter of a well-known type;

FIG. 3 diagrammatically shows the device according to the invention; and

FIGS. 4A to 4H show different chronograms allowing to display the working sequence of the device of FIG. 2.

DESCRIPTION OF THE PREFERRED EMBODIMENTS

Figure 2A:
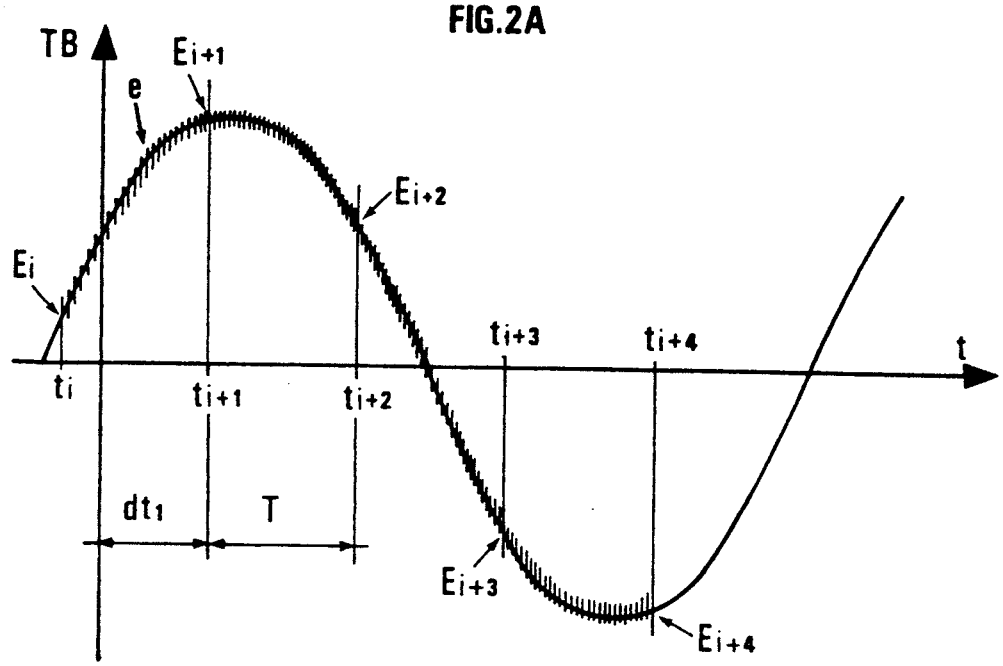
FIG. 2A shows a first chronogram of the sampling of any signal to be measured.

The device 1 of a well-known type shown in FIG. 1 delivers, for example, digital words of P bits with a sampling frequency f by using the combination in series of two integrated circuits 2, 3 which can be found in several manufacturers' catalogues, and based on the use of delta-sigma modulators. The first element 2 is a converter delivering in series digital words of a smaller format $p<P$ with a sampling frequency $F=k.f$ where k is an integer greater than 1. The second element 3 is a digital filter of the F.I.R. type (Finite Impulse Response) which works out an average from a certain number of samples successively coming from converter 2. As an example, converter 2 produces 1-bit digital words at a frequency of 256 KHz, and the digital filter sums a very large number of successive samples to produce 20-bit digital words at least at a frequency of 1 kHz. The sampling frequency and the successive summation orders transmitted to the digital filter 3 are produced by a clock 4 delivering synchronization signals.

Device 1 carrying out a summation of a certain number of samples obtained by over-sampling to form N-bit words, each sample it produces is shifted in time in relation to the instants fixed by the inner clock thereof.

Figure 2B:
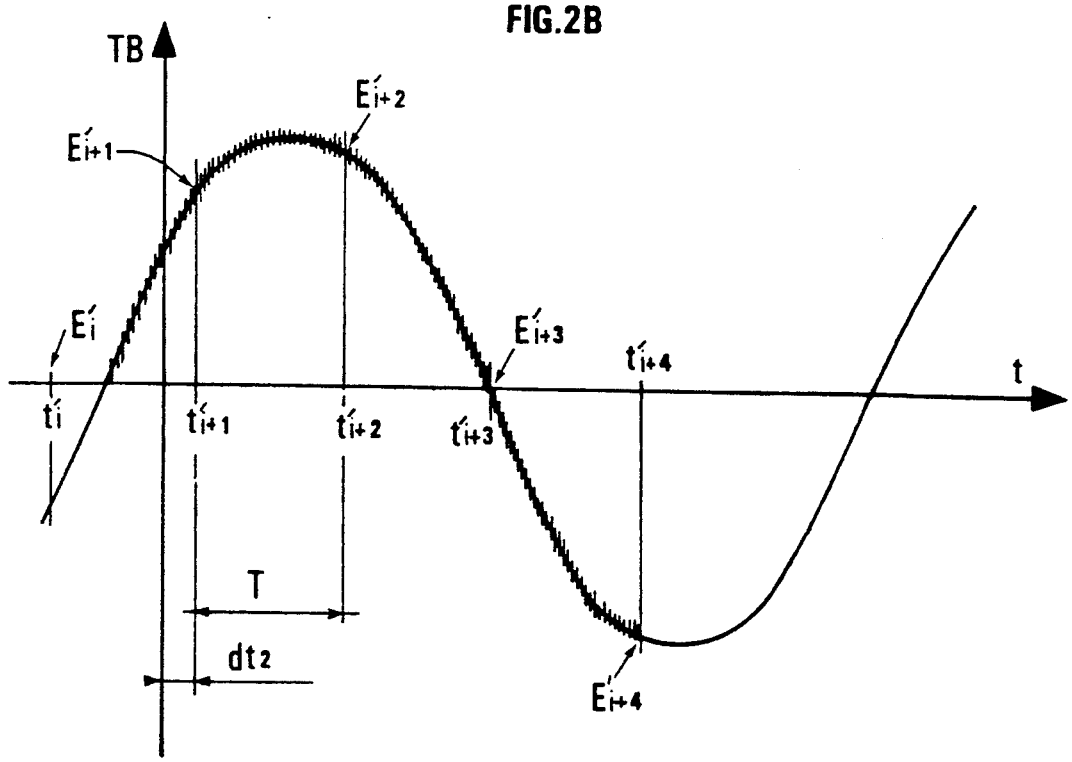
FIG. 2B shows a second chronogram of the sampling of the same signal, similar to the first one but shifted in time.

Such a device works correctly in all the cases where a precise adjustment of a sequence of digitized samples in relation to an outside event, whatever the instant where it occurs may be, is not sought. It can be seen in FIG. 2a that the successive samples $E_i, E_{i+1} \ldots E_{i+4}$, which are each one the result of the summation of a set of samples e, are produced at the output of the digital filter 3 with a period T at the successive instants $t_i, t_{i+1} \ldots t_{i+4}$ which are imposed by the inner clock 4. An outside event may occur at any time TB ranging between any two successive samples, $E_i$ and $E_{i+1}$ for example, and in this case, the time interval dt1 between the instant TB and the instant $t_{i+1}$ of production of the first sample after the signal TB may have any value ranging between 0 and T. The same signal coming from an identical device 1 working with an inner clock not synchronized with the first one produces (FIG. 2B) a series of samples E'i ... E'i+4, etc, of the same period T but at different instants t'i ... t'i+4, etc. The time interval dt2 between the instant TB and the instant t'i+1 for example of production of the first sample after it will be different. If a large number of such devices is used, a series of samples dispersed in relation to one another and in relation to the imposed instant TB are obtained.

The device according to the invention comprises a converter 2, a digital filter 3 and a clock 4, analogous to those of the device of FIG. 1. Filter 3 receives on a first input a synchronization signal SY and on a second input a clock signal CLK.

The device according to the invention also comprises a memory 5 with a determined N capacity and a logical control unit 6 which, as described further on, will allow the readjustment on validated samples coming from the digital filter 3.

The clock signal CLK and a synchronization signal SY are applied at inputs of filter 3. The signals SYNC define the instants of production by filter 3 of the validated samples. Connections allow the clock signals CLK and synchronization signals SYNC, derived from the signals CLK and SYNC respectively, to be applied to the converter 2 and to the logical unit 6. The output of converter 2 producing bit by bit the successive "over-samples" DO is connected with an input gate I/i of the logical unit 6. An output gate I/o of the logical unit producing bit by bit over-samples DI is connected with an input of the digital filter 3. The logical unit 6 includes an input for receiving the reference signal TB. Connections between the logical unit 6 and the memory 5 make it possible to apply to the memory reading control signals RD, writing control signals WR and digital word control signals ADD referring to the memory addresses implicated in the exchanges and, in return, to transfer towards the logical unit the extracted DATA. In the logical unit 6, a counter (not shown) is supplied by the clock signal H, and the counter is reset each time a new validated sample is produced by the digital filter 3. The content of this counter permanently represents the time interval dt passed since the production of the last validated sample produced by the memory 5.

The function of the logical unit 6 is to pilot the writing of the bits produced by converter 2 into memory 5 and the selective transfer thereof towards filter 3.

The memory 5 is a F.I.F.O. (First-In-First-Out) revolving type memory. It is managed by a writing pointer WR to designate the address of memory 5 where a new sample coming from converter 2 is to be written, and by a reading pointer RD designating the address where the sample to be transferred towards filter 3 is to be taken. Each new writing goes together with a shift of the pointer towards the following address of the memory and, if the end of memory address is reached, with a return to the beginning address. The same shift of the reading pointer to the following address takes place at each new reading of a stored sample with a return to the beginning of the memory 5 when the pointer has reached the last address of the memory.

In the particular case where the reading and the writing pointers designate the same address, the memory acts as for a delay line. The oldest datum is read and a new datum is written down instead. The applied delay depends on the size of memory 5.

The converter 2 (A/D.C.) over-samples the signals with a period t (FIG. 4B). Samples are taken on the signals to be measured with a period T, a multiple of the period t (FIG. 4A), and the digital filter 3 delivers the digitized samples V3, V4, etc, with a certain delay R which is inherent in the working principle and which is equal to a certain number of over-sampling periods t (about 25, for example). The reference signal TB arrives at an instant which, in an autonomous working mode, takes place between any two instants (e11 and e12 on FIG. 4). A sample e'11 is to be taken on the signal to be measured at one of the instants t1 or t2 delimiting the over-sampling interval where the reference signal TB arrives (FIG. 4C). The memory 5 is symbolized on FIG. 4D by the content M of over-samples in time thereof. On FIG. 4D, it is positioned in relation with the series of samples of FIG. 4A. The bits (DI) coming out of it towards filter 3 are shifted by the interval R in relation to the sampling instant of e1. Those entering, coming from converter 2, are shifted by the content in time of memory 5. This memory interval M moves with each over-sampling impulse of period t.

The device works as follows:

1) Before the signal TB arrives, the logical unit is adapted for managing the memory 5 as a delay line, i.e. the reading and writing pointers designate the same address. At each reading/writing cycle, the logical unit 6 pilots the extraction of the oldest bit at the common address designated by the pointers RP, WP, the transfer thereof towards filter 3 and then the writing at the same address of the new entering bit supplied by the converter 2, followed by the shift of the common pointer to the following address.

At each output (period T) of a new sample validated by filter 3, the counter in the logical unit 6 which supplies the variable dt is reset.

2) The arrival of the signal TB has the effect of immobilizing the content of the counter inside the logical unit 6, which then shows the time passed between the last validated sample from filter 3 (s1 on FIG. 4E) and the instant of arrival of signal TB. The logical unit then controls the dt-row shift of the reading pointer RP in relation to the writing pointer WP (see FIG. 4F), and we have:

RP=WP+Fdt or

RP=WP+Fdt−N if RP becomes greater than N, where N is the content of memory 5.

3) Between the instant TB and the delivery by filter 3 of a validated sample, at each impulse of the clock CLK, the logical unit pilots:

a) the writing of a bit supplied by the converter 2 at the address given by the writing pointer and the translation by one row thereof; and b) the transfer towards filter 3 of the bit at the address given by the reading pointer RP without any further shift of this pointer which is not changed.

This appears on FIG. 4G through a shift of the memory interval M, the reading pointer being unchanged.

4) From the instant when filter 3 produces a sample and at each impulse of the over-sampling clock CLK, the logical unit 6 pilots a normal reading/writing cycle with the writing of a new bit produced by the converter 2 at the address given by the reading pointer, a shift of this pointer, a reading of the bit at the address designated by the reading pointer and a shift thereof. Because of the readjustment, the samples e'1, e'2 ... e'7 (FIG. 4C) which are in the interval of duration 2R prior to the address of the reading pointer cannot be validated. The validated digitized samples s'8, s'9, etc (FIG. 4H), correspond to the bits stored afterwards, at the end of the previous interval 2R.

It can be seen that, through this shift of the reading pointer RP towards bits written in memory 5 more recently, the bits summed by filter 3 will correspond to an analog sample (e'11 in this case) delayed in relation to the corresponding sample obtained in the autonomous working mode (e11 in this case) in order to be as close as possible to signal TB.

Therefore, if several devices (such as that which has been described above) working with the clock frequency receive the same signal TB, they will respectively deliver a series of validated samples which will all be substantially synchronous, to within an over-sampling period t at the most some microseconds in practice.

The series of samples which have been taken (e'11, e'12, etc) are preferably readjusted on the instants T1 or T2 (FIG. 4B) immediately surrounding the instant TB.

It would nevertheless be possible to select, for a particular application, a different readjustment in relation to this instant TB, but still common to all the devices, without departing from the scope of the invention.

The numerical values given for the over-sampling and production frequencies of the validated samples, as well as for the format of the digital words, are not limitative. The described principle of storage and shifting of the over-samples can be applied to any combination of over-sampling and digital filtering means and in other application fields without departing from the scope of the invention.

We claim:

1. A device for synchronizing sampling of measuring signals with a reference signal marking an outside event, said device comprising a digitizing assembly including an analog to digital converter of the over-sampling type, a clock for producing a synchronization signal, and a digital filter adapted for producing, from the measuring signals and with a fixed period which is a multiple of a sampling period, a series of validated samples, each validated sample resulting from summation of a determined number n of samples from the analog to digital converter; and shifting means for forcing production, by the digital filter, of one series of validated samples, the first sample of said one series of validated samples corresponding to a sample taken on an input signal with a shift independent of the reference signal.

2. A device as claimed in claim 1, wherein said shifting means are adapted for forcing the production by said digital filter of said first validated sample, with a shift less than said fixed period.

3. A device as claimed in claims 1 or 2, wherein said shifting means for forcing production by the digital filter of the first validated sample comprise a memory for a number N of samples greater than the number n of samples to be summed by the digital filter to produce a validated sample, and a control assembly adapted, at the reception of said reference signal, for ordering selective extraction of n samples selected according to the time of reception of the reference signal and transferring thereof into said digital filter, whereby the first sample validated after the reference signal produced by the digital filter corresponds to a sample taken on the measuring signals with a shift less than a predetermined number of sampling periods.

4. A device as claimed in claim 3, wherein said control assembly is adapted for ordering the extraction of the n samples preceding the arrival of the reference signal and for transferring the same into said digital filter.

5. A device as claimed in claim 3, wherein said control assembly is adapted for ordering extraction of n samples distributed in time on either side of the instant of arrival of the reference signal.

6. A device as claimed in claim 3 wherein the memory is fitted with a writing pointer and a reading pointer, and the control assembly comprises a counter for storing the number of sampling periods in a time interval and at the most equal to one of said fixed periods, making it possible to localize the time of arrival of said reference signal, and means for shifting said pointers in relation to one another according to the number stored by said counter, in order to select the samples constituting the first sample validated after the reference signal.

7. A device as claimed in claim 3 wherein the memory is of the F.I.F.O. revolving type, designed for working with a delay line, the delay applied to the samples transmitted to said digital filter being less than the time required for sampling of the N samples in the memory.

8. A method for synchronizing, with a common reference signal marking an outside event, sampling of measuring signals respectively by a plurality of signal digitizing assemblies, each assembly comprising an analog to digital converter of the over-sampling type, a clock producing synchronization signals, and a digital filter adapted for producing from the measuring signals and with a fixed period a series of validated samples resulting from summation of a sequence of n successive samples coming from the analog to digital converter and obtained by over-sampling, said method comprising:

storing a determined number N of samples greater than a number n of each sequence of samples coming from each one of said analog to digital converters before being applied to the corresponding digital filter, and selecting among permanently stored N samples of each measuring signal a time shifted sequence of n successive samples, so that a corresponding validated sample coming from each digital filter corresponds to a sample taken on each signal with a shift independent of the reference signal and substantially the same for all the digitizing assemblies.

9. A method as claimed in claim 8 wherein the time shift applied for selecting each sequence is obtained by measuring the time separating the validated samples from the reference signal.

10. An analog-to-digital converting system comprising:

at least one digitizing assembly including an over-sampling converter means for producing from analog signals to be converted a series of low resolution digital signals; clock means for generating an over-sampling clock signal; and a digital filter means for summing up a determined number of said low resolution digital signals, said digital filter means producing in succession from said series higher resolution digital words with a fixed period which is a multiple of the period of the over-sampling clock signals; and means for synchronizing with a reference signal marking occurrence of an outside event, production of validated digital words by said digital filter means, said synchronizing means comprising shifting means for forcing production by said digital filter means of validated digital words, a first produced validated digital word corresponding to a sample picked up on the analog signals with a shift independent of said reference signal.

11. An analog-to-digital converting system comprising:

a digitizing assembly including an over-sampling converter means for producing from analog signals to be converted a series of low resolution digital signals; clock means for generating an over-sampling clock signal; and a digital filter means for summing up a determined number of said low resolution digital signals, said digital filter means producing in succession from said series higher resolution digital words with a fixed period which is a multiple of the period of the over-sampling clock signals; and means for synchronizing with a reference signal, marking occurrence of an outside event, production of validated digital words by said digital filter means, said synchronizing means comprising shifting means for forcing production by said digital filter means of validated digital words, a first produced validated digital word corresponding to a sample picked up on the analog signals with a shift less than the fixed period.

12. An analog-to-digital converting system comprising:

at least one digitizing assembly including an over-sampling converter means for producing from analog signals to be converted a series of low resolution digital signals; clock means for generating an over-sampling clock signal; and a digital filter means for summing up a determined number of said low resolution digital signals, said digital filter means producing in succession from said series higher resolution digital words with a fixed period which is a multiple of the period of the over-sampling clock signals; and means for synchronizing with a reference signal, marking occurrence of an outside event, production of validated digital words by said digital filter means, said synchronizing means comprising shifting means for forcing production by said digital filter means of validated digital words, said shifting means including a memory means for a number N of low resolution digital signals greater than a number n of low resolution digital signals to be received and summed by said digital filter means to produce a digital word, and a control assembly for controlling at reception of said reference signal, selective extraction of said low resolution digital signals selected according to the time of reception and transfer thereof into said digital filter means, whereby a first produced validated digital word validated after said reception time corresponds to a sample picked up on said analog signals with a shift less than a predetermined number of periods of said over-sampling clock signal.

13. A converting system as claimed in claim 12, wherein said control assembly is adapted for controlling selective transfer of n low resolution digital signals preceding said reception time into said digital filter.

14. A converting system as claimed in claim 12, wherein said control assembly is adapted for controlling selective transfer of n low resolution digital signals distributed in time on either side of said reception time.

15. A converting system as claimed in claims 12, 13, or 14, wherein said memory means is provided with a writing pointer and a reading pointer, said control assembly comprises counter means for storing said number of n low resolution digital signals in a time interval and at the most equal to one of said fixed periods, thereby allowing localizing said reception time, and means for shifting said writing and reading pointers in relation to each other according to said number of n stored low resolution digital signals by said counter means, so as to select the low resolution digital words forming said first digital word validated after the reference signal.

16. A converting system as claimed in 12, wherein said memory means comprises a F.I.F.O. type memory and a delay line for applying to low resolution digital words transmitted to said digital filter means a delay at most equal to the time for sampling said N low resolution digital words.

17. A method of synchronizing with a common reference signal marking an outside event production from analog signals of validated digital words by a plurality of signal digitizing assemblies, each assembly including an over-sampling converter means for producing from analog signals to be converted a series of low resolution digital signals, clock means for generating an over-sampling clock signal, and a digital filter means for summing up a determined number n of said low resolution digital signals, said digital filter means producing in succession from said series higher resolution digital words with a fixed period which is a multiple of the period of the over-sampling clock signals, said method comprising:

storing a determined current number N of low resolution digital signals greater than said determined number n of low resolution digital signals from each one of said over-sampling converter means before being applied to the associated digital filter means;

selecting among the N current low resolution digital signals stored for each analog signal a time shifted sequence of n of said digital signals, so that the resulting validated digital word issuing from each digital filter means corresponds to a sample picked up on each analog signal with a shift independent of the time of arrival of said reference signal and substantially the same for all the digitizing assemblies.

18. A method as claimed in claim 17, wherein the time shift applied for selecting each sequence is obtained by measuring a time interval between instants of production of said validated digital words from said time of arrival.

* * * * *